United States Patent
Koprowski

[19]

[11] Patent Number: 6,021,514
[45] Date of Patent: Feb. 1, 2000

[54] LIMITED LATCH LINEHOLD CAPABILITY FOR LBIST TESTING

[75] Inventor: Timothy John Koprowski, Newburgh, N.Y.

[73] Assignee: International Business Machines Corporation, Armonk, N.Y.

[21] Appl. No.: 09/012,047

[22] Filed: Jan. 22, 1998

[51] Int. Cl.$^7$ .................................................. G01R 31/28
[52] U.S. Cl. ........................................................... 714/733
[58] Field of Search .................................. 714/733, 724, 714/720

[56] References Cited

U.S. PATENT DOCUMENTS

| | | | |
|---|---|---|---|
| 5,383,195 | 1/1995 | Spence et al. . | |
| 5,539,753 | 7/1996 | Conner et al. | 714/30 |
| 5,661,732 | 8/1997 | Lo et al. | 714/33 |
| 5,887,004 | 3/1999 | Walther | 714/726 |

OTHER PUBLICATIONS

IBM Journal of Research and Development, G322–0209–00. vol. 41, No. 4/5, Jul./Sep. 1997, pp. 611–627.

*Primary Examiner*—Albert De Cady
*Assistant Examiner*—Jason Greene
*Attorney, Agent, or Firm*—Lynn L. Augspurger

[57] ABSTRACT

A method of LBIST testing of the entire chip logic whereby intermittent faults can be eliminated. LBIST control logic is programmed to apply linehold states to specified latches within the chip. Latches which feed logic that has intermittent faults can be held to a specified '0' or '1' state such that the intermittent faults causing intermittent signatures can be eliminated. LBIST testing can proceed on looking for the next failure, if one existed, or proving that the remaining logic contains no faults. The LBIST design contains logic for generating linehold controls that will apply a specified linehold state to selected latches during the scan operation portion of the LBIST test.

11 Claims, 2 Drawing Sheets

LIMITED LATCH LINEHOLD CAPABILITY FOR LBIST TESTING

FIELD OF THE INVENTION

This invention is related to computer system chips and in particular to an improved isolation/removal of faults during logic built in self test (LBIST) testing via latch state controls using lineholds.

BACKGROUND OF THE INVENTION

LBIST (Logic Built-in Self-Test) is used extensively within IBM to test for both DC and AC faults in the logic and some portions of the arrays. Published material about LBIST include IBM's Journal of Research and Development vol 41 number Jul./Sep. 4/5 1997 pages 611–627. It is the primary mechanism to test the chip logic and is used at all levels of test—chip, MCM and system and is incorporated herein.

The major components of LBIST are a PRPG (Pseudo-Random Pattern Generator) used to generate the test patterns, a MISR (Multiple Input Signature Register) to compress the test results and the STCM (Self-Test Control Macro) that is used to apply the clocks and controls to the PRPG, MISR and system logic to perform the test. The PRPG applies data to the system logic via multiple parallel scan chains which are connected between the PRPG and MISR.

A limitation of LBIST is the requirement that all system latch states must have a known, predictable value during LBIST as the latch states are compressed into the MISR to generate the result signature. If even 1 of the system latch states is unknown or intermittent, the MISR signature will be incorrect or intermittent and LBIST cannot be used to test the logic.

Problems can be discovered that cause intermittent latch states. Some of these problems can be due to early design problems or they can be caused by power supply noise or coupled noise related to physical design and process parameters. In either case, LBIST could not be used as an effective test of the logic. Also, LBIST is the key logic problem diagnosis tool and, once an intermittent problem is encountered, the prior version of LBIST becomes ineffective at any additional problem diagnosis.

SUMMARY OF THE INVENTION

This invention forces selected latches to known states when the PRPG generates the test patterns. This forcing of latches to known states is referred to as a "linehold". The latches can be forced such that the logic no longer generates intermittent faults or such that the switching activities that generated the power supply or coupled noise are eliminated. A new stable MISR signature can now either be calculated or empirically obtained from a known good chip.

These improvements allow LBIST to be used either as an effective logic test or to continue diagnosing chip problems beyond those problems eliminated by the linehold.

These and other improvements are set forth in the following detailed description. For a better understanding of the invention with advantages and features, refer to the description with reference to the following drawings.

DETAILED DESCRIPTION OF THE INVENTION

Before considering our preferred embodiments in detail, it may be worthwhile to illustrate, by way of example, that in accordance with the invention, if we start LBIST testing the entire chip (i.e. all logic being tested with random patterns) and find an intermittent fault in logic section 1 of the chip being tested, some of the latches in scan chain feeding logic section 1 could be forced to a specific state ('0' or '1') using the linehold feature that would prevent the intermittent fault from occurring. With the intermittent LBIST signature eliminated, LBIST testing can proceed on looking for the next failure, if one existed, or proving that the remaining logic contained no faults.

Figure 1:
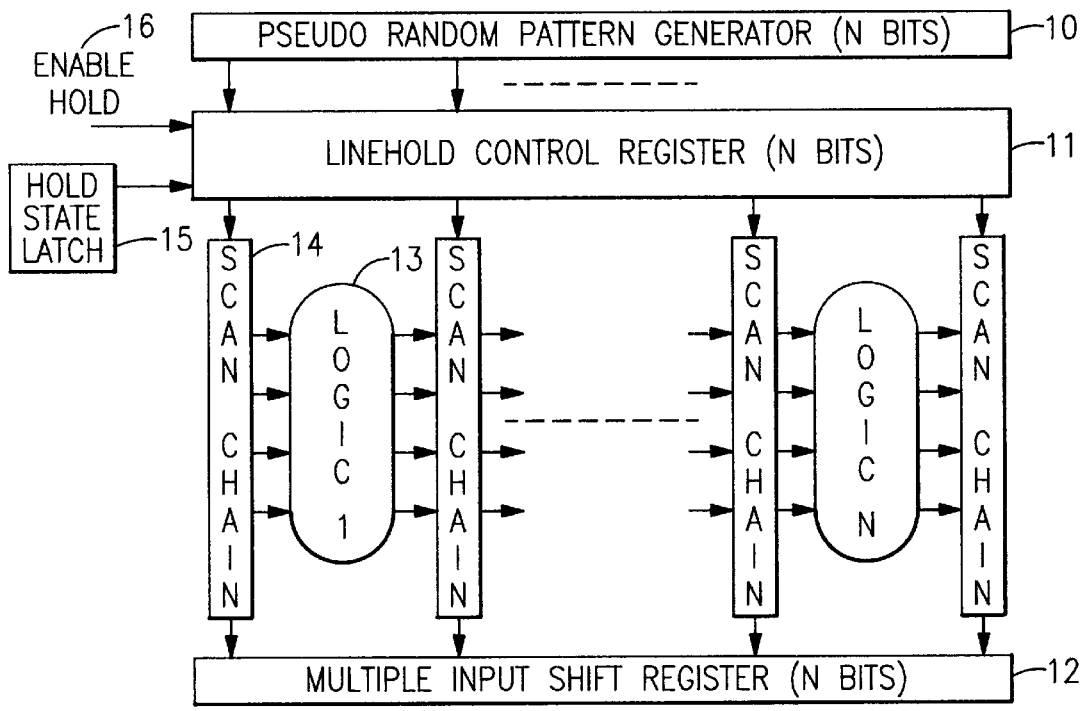
FIG. 1 shows schematically an overview of the LBIST structure containing the linehold control register.

Turning now to our invention in greater detail, FIG. 1 shows a high-level overview of the chip LBIST implementation for LBIST testing of the entire chip logic enabling elimination of intermittent faults with the use of a PRPG (Pseudo-Random Pattern Generator) 10 which is used to generate the test patterns passing through a scan chain to a MISR (Multiple Input Signature Register) 12 to compress the test results and the STCM (Self-Test Control Macro or test control program—not shown—) that is used to apply the clocks and controls to the PRPG, MISR and system logic to perform the test. The PRPG 10 of FIG. 1 generates test data which passes through logic via multiple parallel scan chains which are connected between the PRPG and MISR 12. In accordance with this invention the LBIST control logic is programmed to apply linehold states to specified latches within the chip. Latches which feed logic that has intermittent faults can be held to a specified '0' or '1' state such that the intermittent faults causing these intermittent signatures can be eliminated. LBIST testing can proceed on looking for the next failure, if one existed, or proving that the remaining logic contains no faults. The LBIST design contains logic for generating linehold controls that will apply a specified linehold state to selected scan chain latches during the scan operation portion of the LBIST test. The Pseudo Random Pattern Generator(PRPG) 10 having N bits generates the pseudo-random test data which passes through to the linehold control register 11 (responsive to an enable hold signal 16 and the state of a hold state latch 15) and this test data then is scanned into the scan chains 14 as the test pattern for the scan operation portion of the LBIST test of the chip. Clock signals are applied to the logic 13 of the logic section 1 which enables some of the latches in scan chain feeding logic section 1 to be forced to a specific state ('0' or '1') using the linehold feature that prevents an intermittent fault from occurring within logic 13. Thus the result of the test pattern and logic 13 then is scanned out of the scan chains 14 and compressed and stored into the Multiple Input Shift Register (MISR) 12 of N bits to generate a test signature. An enable hold signal 16 which is an input to the linehold control register 11 and generated by the enable hold signal circuit shown in FIG. 2 determines whether or not a linehold should occur on a given scan cycle and the hold state latch 15 which specifies the linehold value that should be applied. The linehold control register 11 specifies which of the scan chains should receive the linehold value. The chip is partitioned into N sections of logic 13 which are fed by N scan chains 14.

Figure 2:
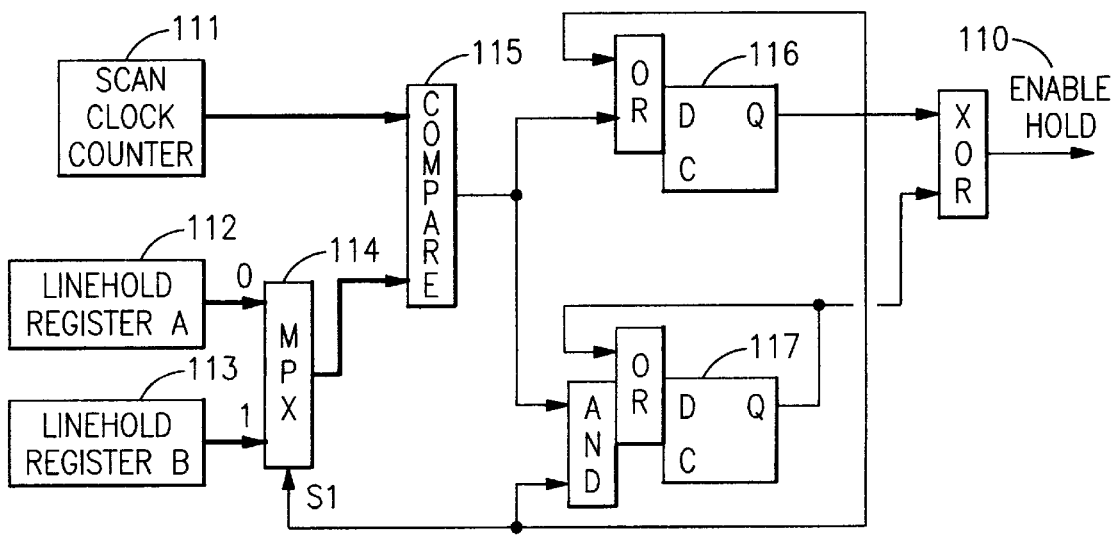
FIG. 2 shows schematically the logic that generates the linehold control signals.

FIG. 2 shows schematically the generation of the enable hold signal 110. The linehold on 116 and linehold off 117 latches are initialized to '0'. The scan clock counter 111 of the LBIST testing circuit which has been used in prior LBIST implementations here keeps track of the number of scan clocks to be applied. The scan clock counter 111 is preset to a value equal to the number of latches in the longest scan chain on the chip then counts down to '0'. Linehold register A 112 is set to the value that specifies when to start the linehold operation and linehold register B 113 is set to the value that specifies when to halt a linehold operation during the scan operation. When the value of the scan counter 111 is equal to the value of linehold register A 112, the output of the compare 115 is a '1' and is latched into the linehold on latch 116. The enable hold signal 110 is now a '1'. The counter continues decrementing and when the value of the scan counter 111 is equal to the value of linehold register B 113, the value of the linehold off latch 117 is set to '1' which forces the value of the enable hold signal 110 to be '0'. The linehold on latch 116 and linehold off latch 117 are reset to '0' prior to each scan operation.

Figure 3:
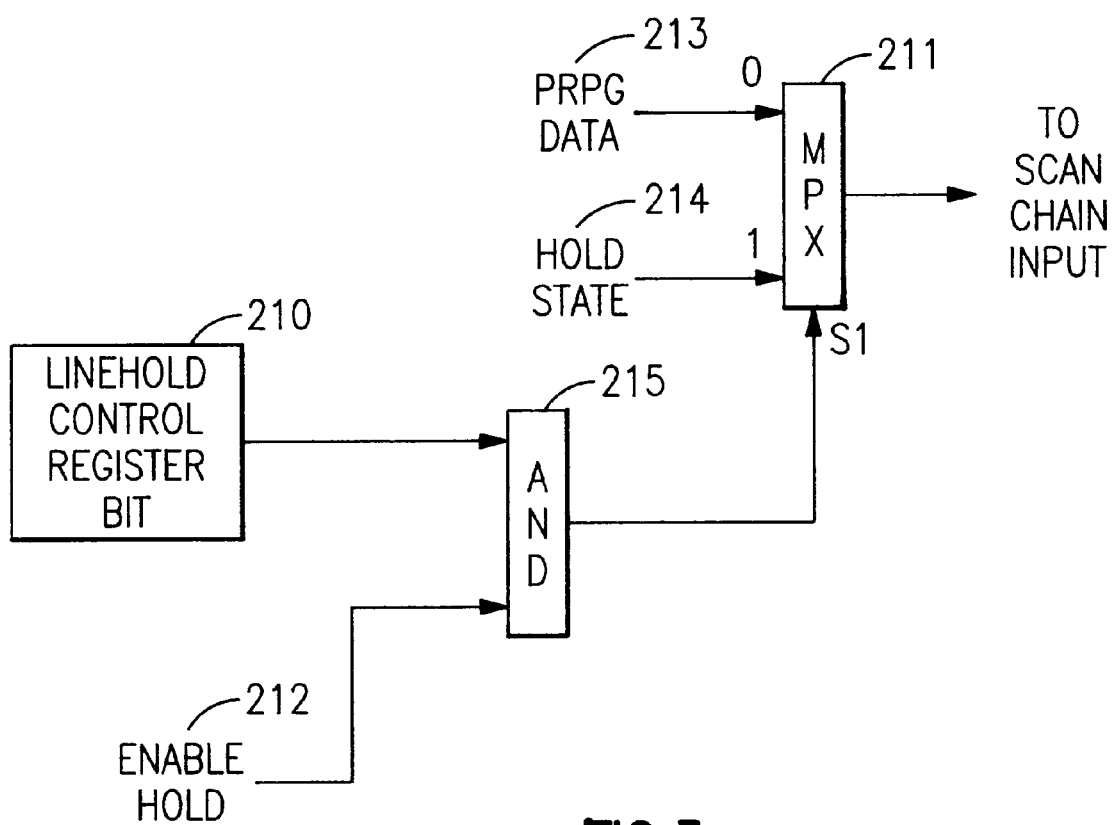
FIG. 3 shows schematically the operation of the linehold control register.

FIG. 3 shows schematically the operation of a single bit of the linehold control register 11 of FIG. 1. If the value of the linehold control register bit 210 is set to a '0', the output of the AND gate 215 is always '0' and PRPG data 213 will always be applied to the scan chain input. If the value of the linehold control register bit 210 is set to '1', the data applied to the scan chain input will be the PRPG data 213 if the enable hold signal 212 is '0' or it will be the hold state 214 if the enable hold signal 212 is '1'. This implementation allows one to specify which scan chains will utilize the linehold operation.

If an intermittent fail was encountered which was caused by random states in a specific group of latches, this design would be used to linehold these latches to a specified value using the logic described above. LBIST testing would then continue and search for the next failure if any existed. Since one can specify which scan chains utilize the linehold operation, several small groups of latches on the chip can be controlled while allowing the remainder of the chip to receive full LBIST patterns.

While we have described our preferred embodiments of our invention, it will be understood that those skilled in the art, both now and in the future, may make make various improvements and enhancements which fall within the scope of the claims which follow. These claims should be construed to maintain the proper protection for the invention first disclosed.

What is claimed is:

1. A method for LBIST testing chips having an LBIST test circuit, comprising the steps of: using a PRPG (Pseudo-Random Pattern Generator) (10) to generate test pattern data for chip testing, and passing said test pattern data through multiple parallel scan chains (14), applying clocks to the system logic (13), then unloading multiple parallel scan chains (14) to a MISR (Multiple Input Signature Register) (12) to compress the test results and in the process with a STCM (Self-Test Control Macro) applying clocks and linehold control signals of LBIST control logic to the PRPG, MISR and chip system logic to perform the test, said PRPG applying test pattern data including linehold states generated by said LBIST control logic to the system logic which then passes through said scan chains to said MISR to provide a test signature, said LBIST control logic being programmed to generate said linehold states to be applied to specified scan chain latches whereby latches of said scan chains are program specified and can be lineheld to a specified state as lineholding latches in order to diagnose and characterize any chip problems, and in the even that intermittent faults are found to exist on the chip during testing, said latches can be lineheld to prevent switching or invalid states in the logic from producing intermittent faults and generating intermittent signatures.

2. A method for LBIST testing chips according to claim 1 wherein said lineheld scan chain latches minimize switching and hold power supply noise to an acceptable level.

3. A method for LBIST testing chips according to claim 1 wherein testing steps include specifying said lineholding scan chain latches to eliminate switching in certain areas of the chip and preventing coupled noise from passing from one signal line to another.

4. A method for LBIST testing chips according to claim 1, wherein said testing starts with LBIST testing of all chip logic and upon finding an intermittent fault in a logic section, specifying lineholding scan chain latches in that section such that the logic section will no longer generate intermittent faults and hence will no longer cause intermittent LBIST signatures, and thereafter proceeding with said LBIST testing to look for any next fault, if any exists, and proceeding until it is proved that the remaining logic contains no faults.

5. A chip having LBIST test logic, comprising
a LBIST circuit on said chip for control and test by diagnosis and characterization of any chip problems,
and other circuits on said chip which are tested by said LBIST circuit, said LBIST circuit including
a PRPG (Pseudo-Random Pattern Generator) (10) for generating test pattern data for chip testing,
LBIST control logic including a linehold control register (11),
multiple parallel scan chains (14)
and a MISR (Multiple Input Signature Register) (12) to compress test results and provide a test signature,
said LBIST control logic being programmed to apply linehold states to specified scan chain latches whereby said latches within the scan chain of the chip can be lineheld to a specified linehold state as lineholding latches in order to diagnose and characterize any chip problems, and in the event that intermittent faults are found to exist on the chip during testing, said latches can be lineheld to prevent switching or invalid states in the logic from producing intermittent faults and generating intermittent signatures.

6. A chip having LBIST test logic according to claim 5, wherein said LBIST control logic contains linehold control logic that specifies the scan cycles for which the linehold state is to be applied to specified scan chain latches.

7. A chip having LBIST test logic according to claim 5, wherein said LBIST control logic contains a linehold state latch that specifies the linehold value that is applied to said specified scan chain latches.

8. A chip having LBIST test logic according to claim 5, wherein said LBIST control logic contains a linehold control register that specifies which scan chains are to utilize the linehold state during the scan operation.

9. A chip having LBIST test logic according to claim 5, wherein if and when a logic section of the chip contains an intermittent fault, the LBIST control logic is set to generate linehold values that are applied to scan chain latches feeding the logic section with the intermittent fault such that said intermittent fault is eliminated and the remaining logic can be tested.

10. A chip having LBIST test logic according to claim 5, wherein if and when a logic section of the chip has excessive switching activity causing power supply noise, the LBIST control logic is programmed to generate linehold values that are applied to selected scan chain latches feeding the logic section with the excessive switching such that the switching activity is minimized to reduce power supply noise.

11. A chip having LBIST test logic according to claim 5, wherein if and when a logic section of the chip has signals that are coupling to one another, the LBIST logic is programmed to generate linehold values that are applied to selected scan chain latches feeding the logic section which contains the coupled signals such that the signals no longer switch and couple to one another.

* * * * *